United States Patent [19]
Fujimori

[11] Patent Number: 6,084,291
[45] Date of Patent: Jul. 4, 2000

[54] TAPE CARRIER FOR TAB, INTEGRATED CIRCUIT DEVICE, A METHOD OF MAKING THE SAME, AND AN ELECTRONIC DEVICE

[75] Inventor: Yoshikazu Fujimori, Suwa, Japan

[73] Assignee: Seiko Epson Corporation, Tokyo, Japan

[21] Appl. No.: 09/081,769

[22] Filed: May 21, 1998

[30] Foreign Application Priority Data

| May 26, 1997 | [JP] | Japan | 9-135363 |
| Jan. 27, 1998 | [JP] | Japan | 10-014598 |
| May 7, 1998 | [JP] | Japan | 10-142211 |

[51] Int. Cl.⁷ .................................................. H01L 23/495
[52] U.S. Cl. ..................... 257/668; 257/669; 257/667; 257/666; 257/672; 257/678; 361/813
[58] Field of Search .................................. 257/668, 669, 257/667, 666, 673, 678; 361/813

[56] References Cited

U.S. PATENT DOCUMENTS 5,767,571  6/1998  Kimura et al. ........................ 257/668
5,825,081  10/1998  Hosomi et al. ......................... 257/668

FOREIGN PATENT DOCUMENTS

| 63-95639 | 4/1988 | Japan . |
| 402155248 | 6/1990 | Japan . |
| 4-130743 | 5/1992 | Japan . |
| 8-186154 | 7/1996 | Japan . |
| 8-274235 | 10/1996 | Japan . |
| 10-92872 | 4/1998 | Japan . |

Primary Examiner—Tom Thomas
Assistant Examiner—Luan Thai
Attorney, Agent, or Firm—Oliff & Berridge, PLC

[57] ABSTRACT

A tape carrier for TAB includes a base material having an insulating property and an elongated shape. The base material has peripheral edges defining an opening for disposing an integrated circuit component. A first pair of portions of the peripheral edges face each other, and a second pair of portions of the peripheral edges face each other. A plurality of connection leads extend from the first pair of portions into the opening. A plurality of dummy leads extend from the second pair of portions into the opening.

14 Claims, 15 Drawing Sheets

FIG. I

TAPE CARRIER FOR TAB, INTEGRATED CIRCUIT DEVICE, A METHOD OF MAKING THE SAME, AND AN ELECTRONIC DEVICE

BACKGROUND OF THE INVENTION

1. Field of the Invention

The invention relates to a tape carrier for TAB for mounting an integrated circuit component, an integrated circuit device packaged with an integrated circuit component mounted therein, a method of making the same, and an electronic device.

2. Description of Related Art

Recent liquid crystal display devices use an integrated circuit device having a driver integrated circuit component mounted thereon for the purpose of connecting the LCD cell to its driver circuit. Such an integrated circuit device generally adopts either the TAB method using a so-called TAB package (also known as a TCP (Tape Carrier Package)), or the COG (Chip On Glass) method in which the driver integrated circuit component is directly connected to the glass substrate. Particularly a TAB package has many advantages, being more compact and thinner than other packages, and appropriate for high-density mounting, allowing electrical testing on a tape carrier, and also permitting mounting in a flexed position; for these reasons it has been widely adopted not only for liquid crystal display devices, but also for other electronic devices.

A conventional TAB package, as shown in FIG. 14, has a tape carrier 131 formed of polyimide or the like, in which is formed a device hole 133 of dimensions larger than the dimensions of an integrated circuit component 132 to be mounted thereon. Inner leads 134 projecting within the device hole 133 are connected by way of bumps 135 to electrodes of the integrated circuit component 132. Moreover, to prevent short-circuits between inner leads 134 or contact of the inner leads 134 with the integrated circuit component 132, and to improve reliability, a protective resin 136 covers the inner leads 134 and the surface of the integrated circuit component 132. The electrodes and bumps 135 are normally disposed along the periphery of the integrated circuit component 132, in order that the lengths of the inner leads 134 are as short as possible in the one-sided holding state (that is, in the state where one side only of the inner leads 134 is supported by the tape carrier 131). Additionally, as disclosed in Japanese Patent Application Laid-Open No. 63-95639, a construction is also known in which in order to mount an integrated circuit component of large scale and having a large number of electrodes, a lead support portion extending into the device hole is provided on the tape carrier, and some of the leads extend thereover.

However, a conventional TAB package as described above has a gap between the peripheral edges forming the device hole 133 and the peripheral edges of the integrated circuit component 132, and the protective resin 136 is provided in order not to expose the inner leads 134 in this gap. As a result, the outer dimensions of the package are considerably larger than the outer dimensions of the integrated circuit component 132 and the mounting area is increased. Additionally, with the miniaturization of the integrated circuit component 132, and a closer pitch for the electrodes and inner leads 134, connecting leads 134a supported on the tape carrier 131 are required to be finer, and a large area is required to bring out the connecting leads 134a since the wiring distance is increased. For this reason, the area of tape carrier used for mounting a single integrated circuit component 132 is increased, the overall package dimensions are further increased, and the mounting area is increased, resulting in a problem of going against the requirement to make the electronic apparatus more compact.

In particular, in the case of a liquid crystal display, as shown in FIG. 15, a plurality of TAB packages 138 (only one of which is shown in the figure), each having a driver integrated circuit component 137 mounted thereon, is connected along the periphery of an LCD cell 139, and further on the outer side thereof is connected a printed circuit board 140 forming a drive circuit. With respect to the overall dimensions of the liquid crystal display device, to increase the liquid crystal display area, it is necessary to reduce the width W of the so-called frame portion. For this purpose, it is necessary, while reducing each of the width w1 of the outer periphery 141 of the LCD cell 139 connected to the TAB package 138 and the width w2 of the printed circuit board 140, to make the TAB package 138 smaller, and thus to reduce its width w3. For this purpose, it is possible first to consider making the driver integrated circuit component 137 smaller, and reducing the corresponding width as much as possible, but in a TAB package of the above-described conventional construction, it is difficult to go smaller than the current size, and there is a problem that the width W of the frame portion cannot be adequately reduced. On the other hand, with the COG method, the connection leads are also formed at the periphery of the LCD cell 139 in addition to a driver integrated circuit component being directly mounted, and it is therefore more difficult to reduce the width W of the frame portion than in the TAB method.

Additionally, with the increasing compactness of electronic apparatus another problem arises. For example, with the move to fine high output pin counts, one of integrated circuit components, employed in a liquid crystal display device or the like, has an elongated shape and electrodes disposed in two rows along its long dimension with wires lead-out in two directions. Such an integrated circuit component and tape carrier are shown in FIG. 16. In this figure, an integrated circuit component 142, and inner leads 144 formed on a tape carrier 143 are connected by thermal bonding by a bonding tool (thermal bonding tool) not shown in the drawing. Here the tape carrier 143 has a large coefficient of thermal expansion with respect to the integrated circuit component 142. For this reason, when the two are subjected to thermal bonding, the tape carrier 143 is thermally bonded in the extended state to the integrated circuit component 142. However, after the thermal bonding, since the tape carrier 143 shrinks with the fall in temperature, the tape carrier 143 pulls the inner leads 144, and the tape carrier 143 is deformed in an arc shape in the vicinity of the integrated circuit component 142. Moreover, as the tape carrier 143 pulls the inner leads 144, there is a possibility of breakage of the inner leads 144.

SUMMARY OF THE INVENTION

The object of the invention is to provide a tape carrier, integrated circuit device, a method of making the same, and an electronic device, enabling miniaturization of electronic apparatus, solving the problems occurring with the miniaturization of electronic apparatus.

(1) The tape carrier of the invention for TAB comprises a base material having an insulating property and an elongated shape. The base material has peripheral edges defining an opening for disposing an integrated circuit component. A first pair of portions of the peripheral edges face each other. A second pair of portions of the peripheral edges face each other. A plurality of connection leads extend from the first pair of portions into the opening. At least one dummy lead extends from the second pair of portions into the opening.

According to the invention, after the integrated circuit component is mounted, the base material which has been heated tries to contract, but the dummy lead provided projecting in the direction of contraction supports the base material. As a result, breakage of the connection leads by shrinkage of the base material can be prevented.

Here, the term "dummy lead" refers to any part which is not used for transmitting or receiving signals or the like, and has no electrical function, and is not particularly concerned with whether or not there is a connection to an electrode of the integrated circuit component.

(2) Some dummy leads may extend from each of the second pair of portions.

(3) The dummy lead may have a width narrower than a width of each of the connection leads.

By this means, the dummy lead is made finer, but because of the dummy lead, the force generated by the contraction of the base material can be withstood. Besides, since the dummy lead is fine, when the sealing material is injected after mounting the integrated circuit component, the sealing material is able to flow positively to the rear of the dummy lead, and residual air bubbles can be prevented.

(4) The dummy lead may have a projection, which is formed in a direction substantially perpendicular to an extending direction of the dummy lead.

By this means, when the sealing material is injected after mounting the integrated circuit component, surface tension is created in the interval between the projection and the integrated circuit component, and an excessive flow of the sealing material from the gap between the integrated circuit component and the opening can be prevented. For this reason the thickness of the sealing material can be made uniform.

(5) The dummy lead may be formed on one surface of the base material and have a bending portion bent toward the other surface of the base material. The projection may extend from the bending portion of the dummy lead.

By this means, since the difference in height between the projection and the integrated circuit component can be assured, an adequate surface tension of the sealing material can be obtained using the difference in height. Besides, since the bending portion produces a difference in height, the projection can be formed to be longer, within a given distance, compared with the case of a flat shape. For this reason, an excessive flow of the sealing material into the opening can be prevented, and the thickness of the sealing material can be made uniform.

(6) The width of the dummy lead may be wider than a width of each connection lead.

By this means, even when the peripheral edges around the opening into which the plurality of connection leads extend are cooled and the opening seeks to expand, this force can be withstood without dummy lead breaking.

(7) The connection leads may extend along a longitudinal direction of the base material, and the dummy lead may extend in a direction substantially perpendicular to an extending direction of the connection leads.

By this means, the connection leads can be brought out in the longitudinal direction of the base material without bending, and the area of the base material can be used effectively.

(8) The integrated circuit device of the invention comprises a base material having an insulating property and having an opening. A plurality of connection leads are provided on the base material. The connection leads extend into the opening. An integrated circuit component is connected to the connection leads inside the opening. The integrated circuit component includes a first portion and a second portion. The first portion is positioned inside of the opening and provided with a plurality of electrodes electrically connected to the connection leads. The second portion faces a portion of the base material. At least one of the connection leads is provided on the portion of the base material to which the second portion faces.

By this means, since the first portion of the integrated circuit component to be positioned in the opening is smaller than the opening, a gap is formed between the peripheral edges of the opening and the first portion. As a result, in the first portion exposed through the opening, flowability of the sealing material on the integrated circuit component is assured, and in the gap between the peripheral edges of the opening and the first portion, the sealing material flows onto the opposite surface. In addition to this advantage, since the connection leads can be provided in the area where the second portion of the integrated circuit component and the base material oppose each other, the external dimensions of the integrated circuit device can be made smaller than in the conventional case.

(9) The pitch between a pair of the connection leads is converted in the portion to which the second portion of the integrated circuit component faces.

By this means, pitch conversion of the connection leads can be carried out in the area in which the projections of the integrated circuit component and the base material overlap, and therefore the external dimensions of the integrated circuit device can be made smaller than in the conventional case.

(10) The outline of the opening may be smaller than the outline of the integrated circuit component.

By this means, the area in which the integrated circuit component faces the base material is increased, whereby this area can be used as a connection lead pitch conversion region, or can be used as a region for bringing out the connection leads, and the freedom of design of the connection leads is increased. Besides, since connection leads can be formed in the area of the base material facing the integrated circuit component around the periphery of the opening, the external dimensions of the overall base material can be made smaller than in the conventional case.

(11) The integrated circuit component may have an oblong shape. The first portion may have an edge portion forming one of the long sides of the oblong shape. The electrodes of the integrated circuit component may be disposed in one row along the long side.

By this means, the connection leads may be disposed in the direction perpendicular to the longitudinal direction of the integrated circuit component, and the connection leads can be made shorter.

(12) The integrated circuit component may have an oblong shape. The first portion may have an edge portion forming one of the long sides of the oblong shape. The electrodes of the integrated circuit component may be disposed in two rows along the one of the long sides.

By this means, while reducing the dimensions of the base material, the electrodes of the integrated circuit component can be disposed in accordance with the number of electrodes, the conditions of connection with the exterior device and circuits, and so forth.

(13) The integrated circuit device of the invention may further comprise a sealing material sealing at least connection portions between the electrodes of the integrated circuit component and the connection leads. At least one dummy lead may extend into the opening. The opening may be formed by peripheral edges. The dummy lead may extend from at least one of a pair of the peripheral edges facing each other. The connection leads may extend into the opening from the other pair of the peripheral edges facing each other.

By this means, after the integrated circuit component is mounted, the heated base material shrinks in the direction of the electrode disposition of the integrated circuit component, and the opening seeks to expand, but the dummy lead extending in this shrinking direction supports the base material. As a result, breakage of the connection leads can be prevented.

(14) The dummy lead may have a width narrower than a width of each connection lead.

By this means, the dummy lead is made finer, but because of the dummy lead, the force generated by the contraction of the base material can be withstood. Besides, since the dummy lead is fine, when the sealing material is injected after mounting the integrated circuit component, the sealing material is able to flow positively to the rear of the dummy lead, and residual air bubbles can be prevented.

(15) The dummy lead may have a projection. The projection may be formed in a direction substantially perpendicular to an extending direction of the dummy lead.

By this means, when the sealing material is injected after mounting the integrated circuit component, surface tension is created in the interval between the projection and the integrated circuit component, and an excessive flow of the sealing material from the gap between the integrated circuit component and the opening can be prevented. For this reason the thickness of the sealing material can be made uniform.

(16) The dummy lead may have a bending portion. The projection may extend from the bending portion of the dummy lead.

By this means, since the difference in height between the projection and the integrated circuit component can be assured, an adequate surface tension of the sealing material can be obtained using the difference in height. For this reason, an excessive flow of the sealing material from the gap between the peripheral edges of the opening and the integrated circuit component can be prevented, and the thickness of the sealing material can be made uniform.

(17) The width of the dummy lead may be wider than a width of each connection lead.

By this means, even when the peripheral edges around the opening into which the plurality of connection leads extend is cooled, and the opening seeks to expand, this force can be withstood without dummy leads breaking.

(18) The dummy lead may be electrically insulated from the electrodes of the integrated circuit component.

By this means, no consideration of the various conditions relating to conduction in the connection of the dummy lead and the integrated circuit component is required, and the form can be made appropriate to the improvement of the bonding strength.

(19) More than half of the connection leads may be formed on the portion of the base material to which the second portion of the integrated circuit component faces.

By this means, since the majority of the connection leads can be formed on the area facing the integrated circuit component, the external dimensions of the integrated circuit device can be made smaller than in the conventional case.

(20) The first group of connection leads may be formed on the portion of the base material to which the second portion of the integrated circuit component faces. The second group of connection leads may be formed avoiding the portion of the base material to which the second portion of the integrated circuit component faces. The first group of connection leads are connected to output sides of the electrodes of the integrated circuit component. The second group of connection leads are connected to input sides of the electrodes of the integrated circuit component.

By this means, the invention can be applied to an integrated circuit component in which the number of output terminals is very much greater than the number of input terminals, such as an integrated circuit component used for driving a liquid crystal display device, for example.

(21) The integrated circuit device of the invention comprises a tape carrier for TAB having a base material, a plurality of connection leads and at least one dummy lead. The base material has an insulating property and has peripheral edges forming a rectangular opening. The connection leads extend into the opening from a pair of the peripheral edges facing each other. The dummy lead extends into the opening from one of the other pair of the peripheral edges facing each other. An integrated circuit component is positioned inside of the opening, electrically connected to the connection leads, and connected to the dummy leads.

According to the invention, after the integrated circuit component is mounted, the heated base material seeks to contract, but the dummy lead extending in this contracting direction supports the base material. As a result, breakage of the connection leads due to shrinkage of the base material can be prevented.

(22) The electronic apparatus of the invention comprises the integrated circuit device, which is mentioned above.

(23) The method of making an integrated circuit device of the invention comprises:

preparing for a base material having an insulating property, having an opening, and having a plurality of connection leads on one surface thereof, the connection leads extending into the opening;

positioning an integrated circuit component in a state where a part of the integrated circuit is positioned inside of the opening, and the remainder faces another surface of the base material with a gap therebetween;

electrically connecting the connection leads to the integrated circuit component through the opening; and supplying a sealing material to the integrated circuit component through the opening with the integrated circuit component heated.

By this means, since the integrated circuit component is heated when the sealing material is injected, the viscosity of the sealing material is reduced, and therefore the sealing material is able to enter the gap between the base material and the integrated circuit component. After injection of the sealing material is completed, when heating of the integrated circuit component is stopped, the viscosity of the sealing material rises. As a result, the sealing material can be retained between the base material and the integrated circuit component.

BRIEF DESCRIPTION OF THE DRAWINGS

The invention is described in detail with reference to the following drawings, wherein.

DETAILED DESCRIPTION OF THE PREFERRED EMBODIMENTS

Figure 1:
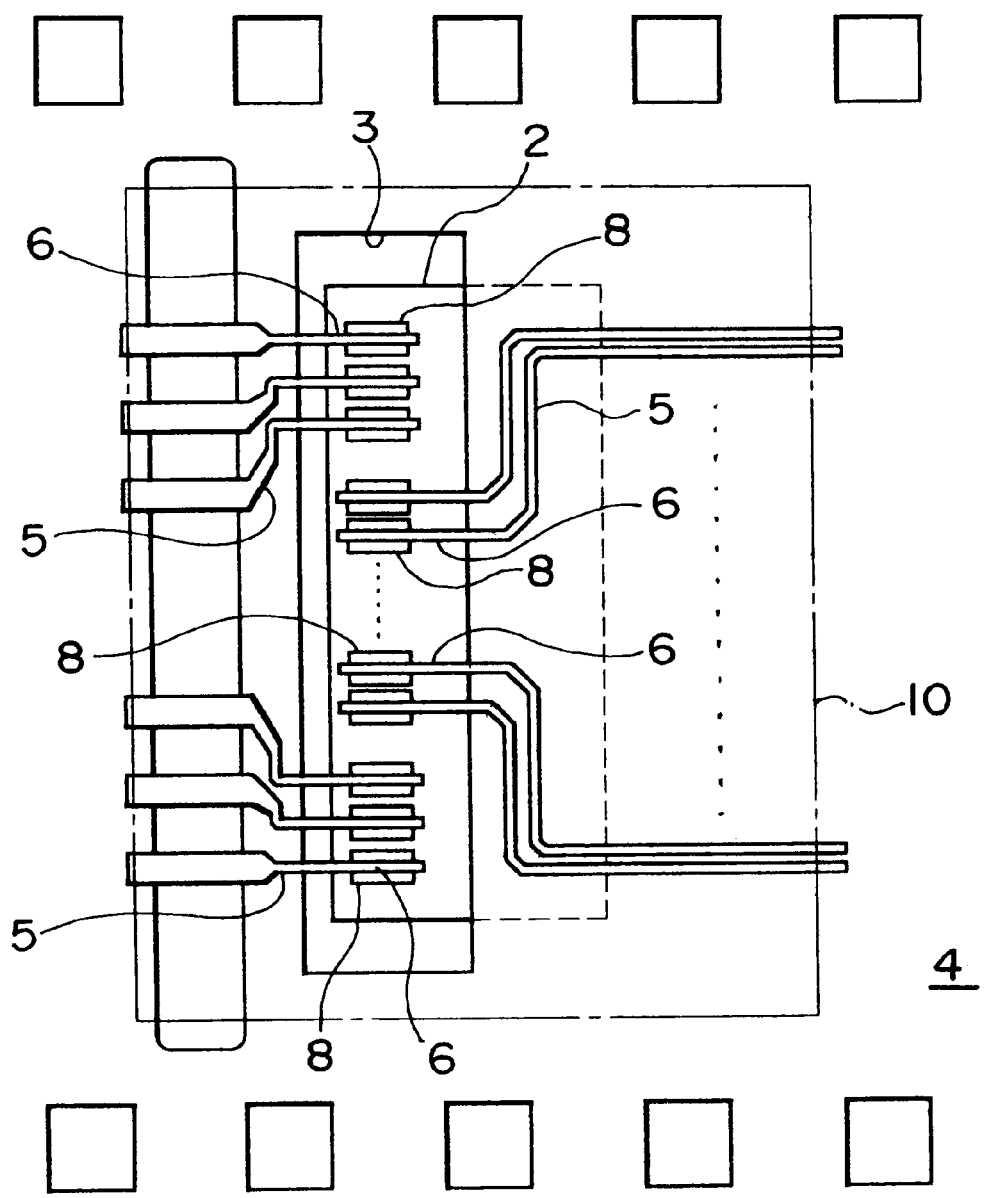
FIG. 1 is a plan view showing part of the tape carrier of an embodiment of the invention.

FIG. 1 shows part of an embodiment of the tape carrier of the invention. As base material, the tape carrier 1 is made of a continuous plastic film tape which is flexible and insulating, and of a polyimide resin, polyester, glass epoxy resin, or the like. In approximately the center thereof is formed a device hole 3 which is an opening corresponding to the integrated circuit component 2 to be mounted. On one surface 4 of the tape carrier 1 are formed a plurality of connection leads 5 of a metal such as copper film. In order to connect the connection leads 5 to bumps 8 provided on the corresponding electrodes of the integrated circuit component 2, inner leads 6 forming portions of the connection leads 5 are disposed so as to project inward from the periphery of the device hole 3. The integrated circuit component 2 of this embodiment is an integrated circuit component for driving an LCD cell of a liquid crystal display device, and in order to reduce the size of the frame portion of the liquid crystal display device when mounted, is of an elongated shape.

The device hole 3 is formed in an elongated shape in the direction perpendicular to the longitudinal direction of the tape carrier 1, and is an rectangle smaller than the surface area of the integrated circuit component 2. Within the device hole 3, one of long sides of the outline of the integrated circuit component 2 is positioned. Preferably, at the long side opposite the above-mentioned long side of the integrated circuit component 2 there is an overlap of a certain width between the tape carrier 1 and the integrated circuit component 2.

Since as described above the integrated circuit component 2 is an LCD cell driver integrated circuit component, the inner leads 6 extend from the opposing long sides of the peripheral edges of the device hole 3, perpendicular to the longitudinal direction of the tape carrier 1, to close to the center of the device hole 3 where the bumps 8 of the integrated circuit component 2 are to be aligned.

According to this embodiment, the outline of the device hole 3 is made smaller than the outline of the integrated circuit component 2, and within the device hole 3 is disposed one long edge of the integrated circuit component 2. As a result, the gap between the device hole and integrated circuit component in the conventional construction, that is to say, the dead space, is eliminated, and connection leads 5 can be provided on an area where the tape carrier 1 and integrated circuit component 2 overlap, so that the area of the tape carrier 1 used for a single integrated circuit component 2 is reduced. In particular, in this embodiment, when used for an integrated circuit component for driving an LCD cell of a liquid crystal display device, the difference between the number of input terminals and the number of output terminals is extremely large (for example, 30 input terminals as against 300 output terminals), and it is therefore possible in the overlapping area to provide an area for bringing out the connection leads 5 for adjusting the spacings between the terminals of the integrated circuit component 2 and the liquid crystal display device. Besides, since the shape of the device hole 3 is significantly smaller in the longitudinal direction of the tape carrier 1, the number of the integrated circuit components 2 which can be held on a tape reel at a given length is greatly increased from the conventional case. By this means, since the tape reel for making the TAB packages has to be replaced less often, the ease of working and production are improved, and it is possible to reduce the making cost. Besides, the dimensions of an integrated circuit device fabricated from this tape carrier 1 are greatly reduced, and the mounting area can be reduced.

The edges of the device hole 3 along the longitudinal direction of the tape carrier 1, that is to say, the positions of the short edges of the device hole 3, may be positioned outside of the integrated circuit component 2, or may be positioned within the area of the integrated circuit component 2. If the short edges of the device hole 3 are positioned outside of the integrated circuit component 2, then the area for the formation of the inner leads 6 is increased, and it is possible to increase the number of inner leads 6, or to increase the pitch of the inner leads 6. On the other hand, if the short edges of the device hole 3 are positioned within the area of the integrated circuit component 2, a larger area can be provided for bringing out the connection leads 5.

Figure 2:
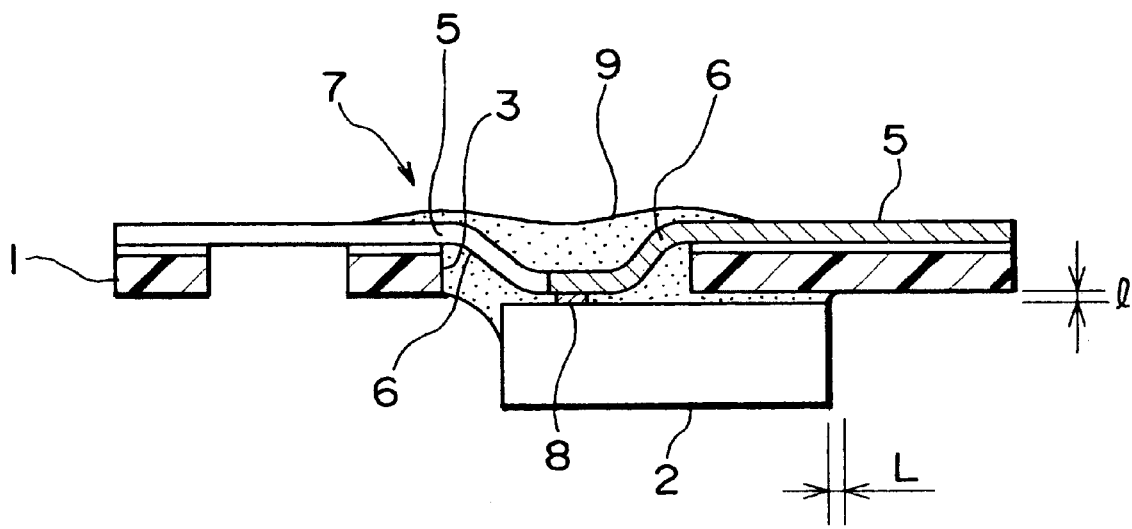
FIG. 2 is a sectional view showing an embodiment of the TAB package integrated circuit device of the invention using the tape carrier shown in FIG. 1.

In FIG. 2, is shown a TAB package integrated circuit device using the tape carrier shown in FIG. 1. In this integrated circuit device 7 the integrated circuit component 2 is a driver integrated circuit component for an LCD cell in the shape of an elongated rectangle, and has a plurality of bumps 8 disposed in a straight line along the long dimension of this rectangle. The device hole 3 is formed approximately in the center of the tape carrier 1, and has the bumps 8 positioned in its center. One side of the device hole 3 is positioned on the inside of the periphery of the integrated circuit component 2.

The packaging is carried out in the conventional manner: the tape carrier 1 in FIG. 1 is positioned with respect to the integrated circuit component 2 as described above, a bonding tool is used to thermally bond each inner lead 6 to the bump 8 of the corresponding electrode, and a protective resin 9 is applied to a certain position, including the integrated circuit component 2 and the inner leads 6, after which an electrical characteristics test is carried out, and finally a punching stage is carried out, along the separation position 10 in FIG. 1.

The protective resin 9 is a thermosetting resin of for example the epoxy type, and is formed to project slightly outside the outer periphery of the integrated circuit component 2, and is conveniently provided so that the length L of the projecting portion is not more than the gap 1 between the integrated circuit component 2 and the tape carrier 1 ($0<L\leq 1$). By the provision of this projecting portion, it can easily be ascertained by external inspection whether all of the portions required to be covered by the protective resin 9 are completely covered.

According to this embodiment, as described in relation to FIG. 1, the form of the device hole 3 is smaller than the outline of the integrated circuit component 2, and one side of the device hole 3 is positioned inside the outer periphery of the integrated circuit component 2. By means of this, the portion of the protective resin which in the conventional construction was formed outside of the integrated circuit component is substantially eliminated, and moreover the area of the tape carrier 1 used is reduced, so that the external dimensions of the integrated circuit device 7 are much smaller than the prior art, and the mounting area can be reduced. In particular with this embodiment, since the inner leads 6 are led out in the direction perpendicular to the long dimension of the integrated circuit component 2, the width of the integrated circuit device 7 can be made extremely smaller compared with the prior art.

Figure 3:
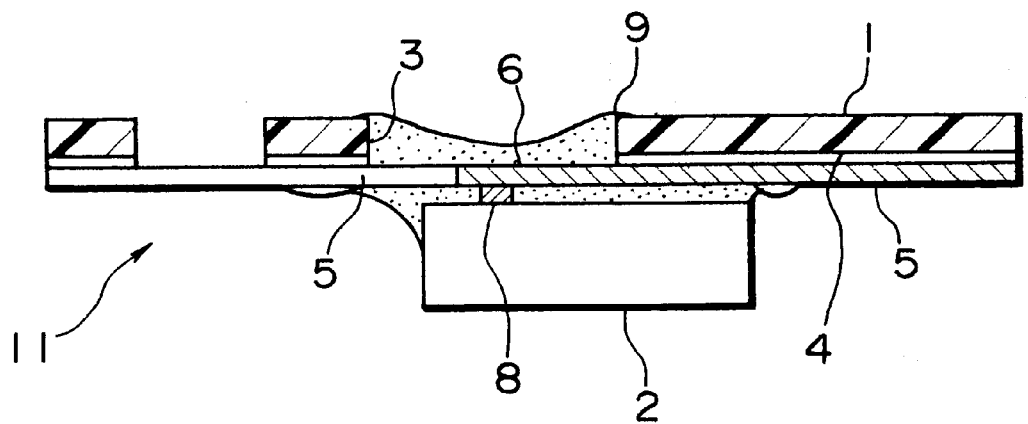
FIG. 3 is a sectional view showing a variant of the embodiment of FIG. 2.

In FIG. 3 is shown an integrated circuit device 11 which is a variant of the embodiment of FIG. 2. Whereas the integrated circuit device 7 of FIG. 2 has the integrated circuit component 2 connected face-down to the tape carrier 1, in this variant the integrated circuit component 2 is connected face-up with respect to the surface 4 of the tape carrier 1 on which the connection leads 5 are formed. In this case again, the outer dimensions of the TAB package 11 can be reduced.

Figure 4:
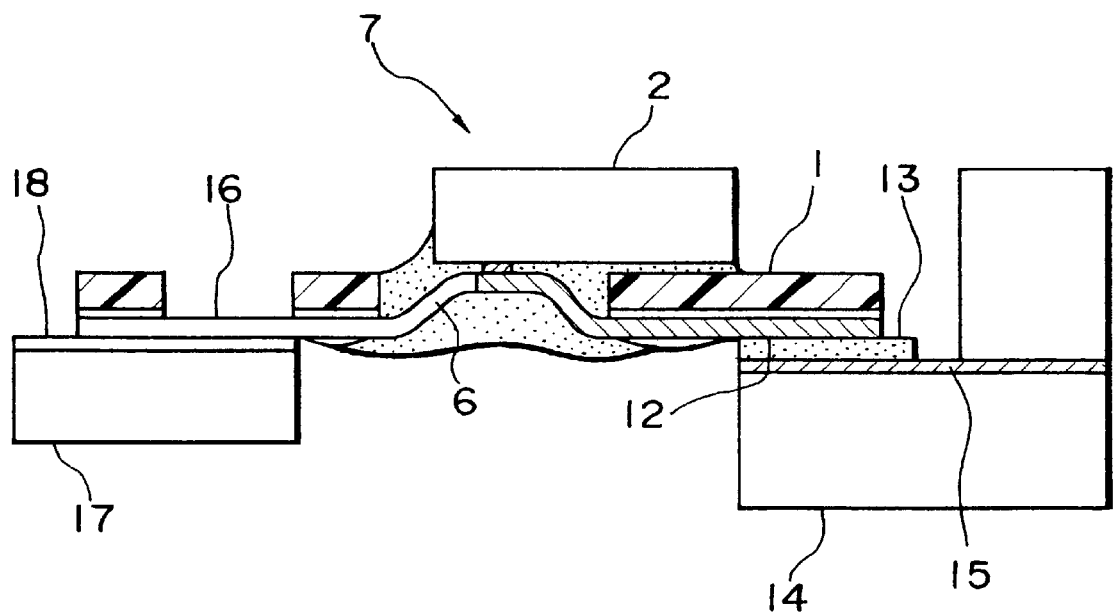
FIG. 4 is a sectional view showing a part of an LCD cell having mounted the TAB package of the embodiment of FIG. 2.

The integrated circuit device 7 of the invention is mounted on an LCD cell of a liquid crystal display device as shown in FIG. 4. The integrated circuit device 7 has, as in the conventional case, outer leads 12 on the output side connected to panel electrodes 15 formed from an ITO film or the like of an LCD cell 14 by using for example an anisotropically conducting adhesive 13 or an optically hardened insulating resin. On the other hand, outer leads 16 on the input side are connected by soldering or the like to corresponding electrodes 18 on a printed circuit board 17 formed from an ordinary glass epoxy substrate and constituting a liquid crystal driver circuit. According to this embodiment, by connecting the integrated circuit device 7 which is made compact, and in particular has a small width, the width of the frame portion can be made substantially smaller.

Besides, according to this embodiment, according to the shape or dimensions of the integrated circuit component 2 to be mounted on the tape carrier 1, or according to the number of electrodes, or the conditions under which the connection to an external device or circuit board is to be carried out, the bumps 8 may be disposed in a plurality of rows.

Figure 5A:
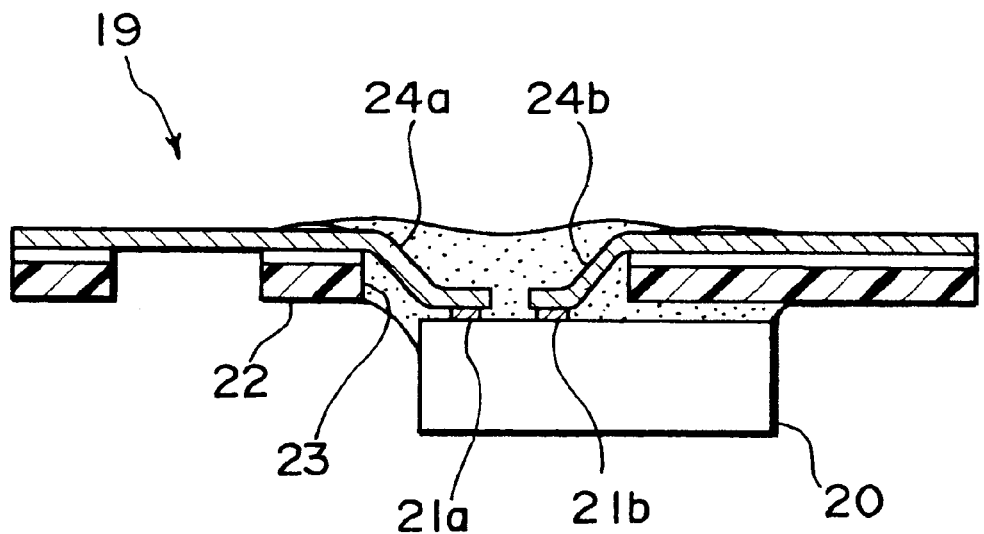
FIG. 5A is a sectional view of a second embodiment of the TAB package integrated circuit device of the invention.
Figure 5B:
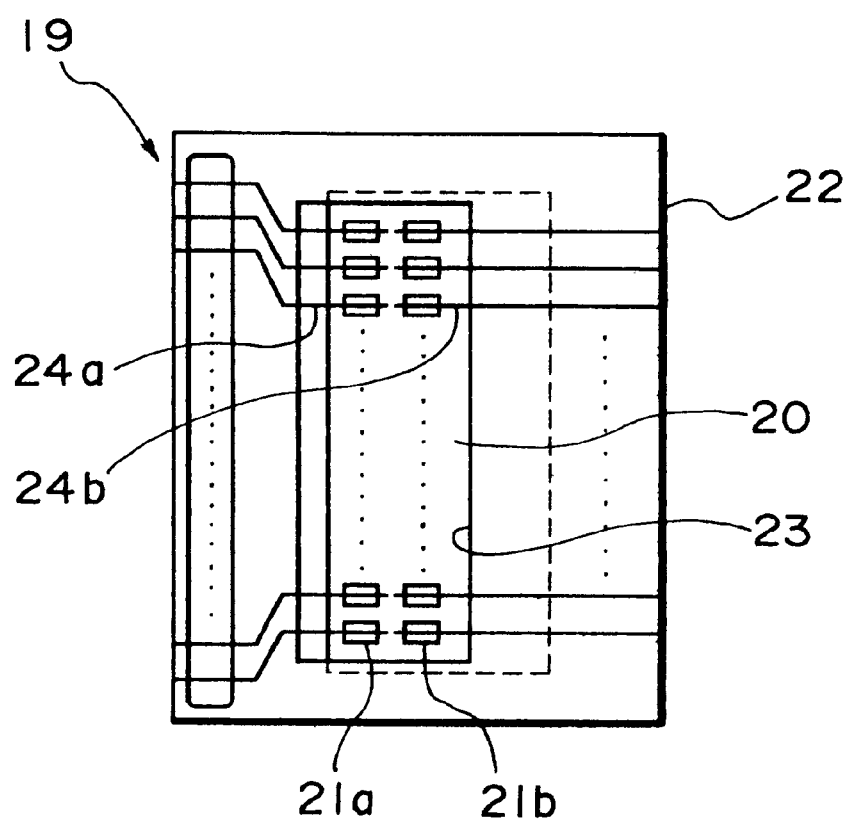
FIG. 5B is a plan view of the same.

An integrated circuit device 19 according to a second embodiment of the invention is shown in FIGS. 5A and 5B, and has the electrodes of an integrated circuit component 20, each half of them disposed in each of two rows in the longitudinal direction, and bumps 21*a* and 21*b* formed on each electrode. A tape carrier 22 has a device hole 23 formed approximately in the center, in a shape smaller than the outline of the integrated circuit component 20, and mutually opposing inner leads 24*a* and 24*b* are formed projecting from opposing edges positioned in the longitudinal direction of the device hole 23, toward the bumps 21*a* and 21*b*. Making the spacing between the rows of bumps 21*a* and 21*b* as narrow as possible, and reducing the dimensions of the device hole 23 is preferable in order to make the integrated circuit device 19 even more compact. In the embodiment shown in FIG. 5, only one of the four sides forming the boundary of the integrated circuit component 20 is positioned within the device hole 23.

Figure 6:
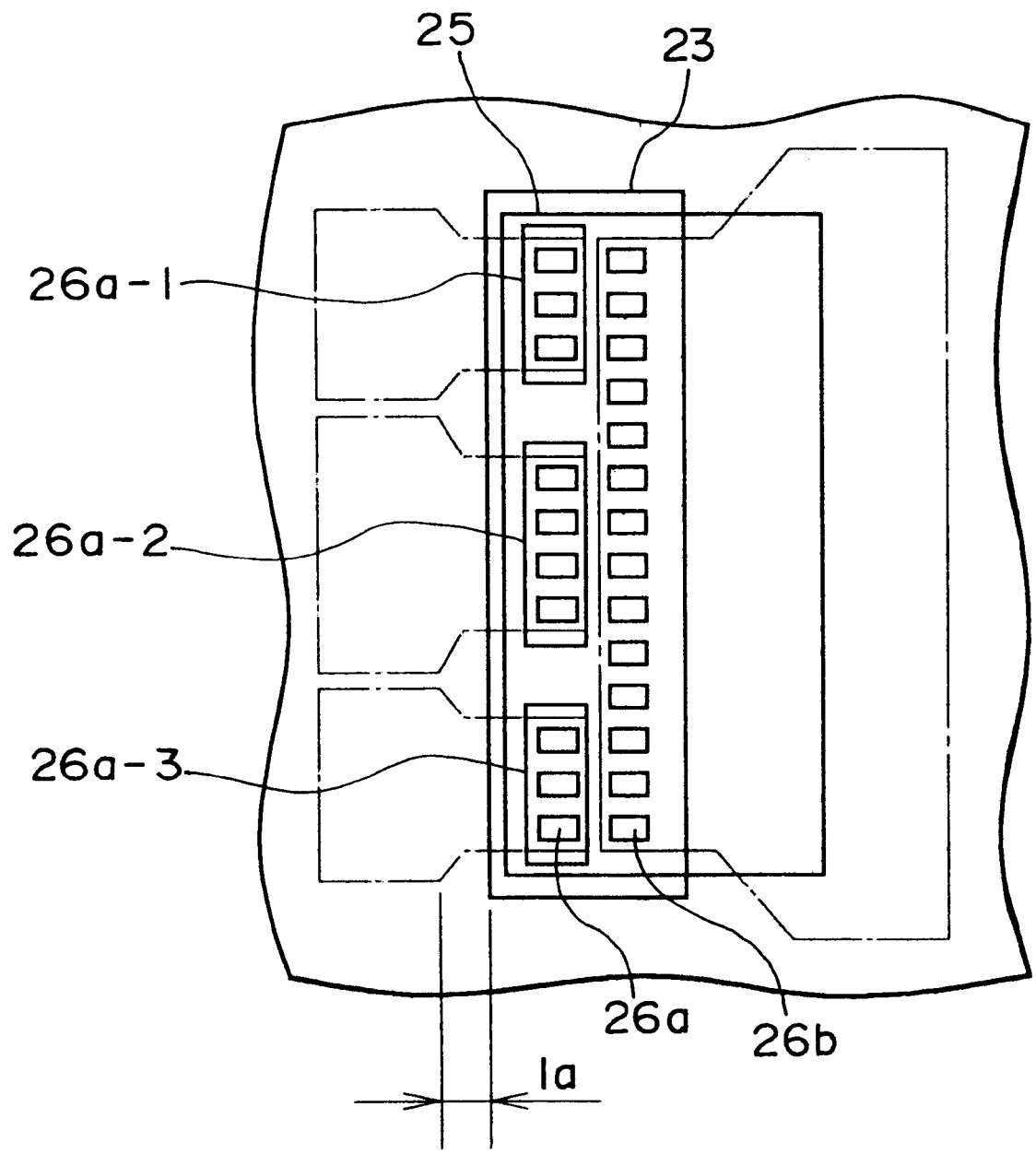
FIG. 6 is a plan view showing a variant of the integrated circuit component used in the second embodiment shown in FIGS. 5A and 5B.

The number of electrodes for which the bumps 21*a* are formed and the number of electrodes for which the bumps 21*b* are formed are not necessarily the same. For example, in the embodiment shown in FIG. 6, an integrated circuit component 25 is a driver integrated circuit component for a liquid crystal display device, and of the two rows, in one are disposed input electrodes and associated bumps 26*a*, and in the other are disposed output electrodes and associated bumps 26*b*. The bumps 26*b* on the output side are provided at a uniform pitch, whereas the bumps 26*a* on the input side are divided into three groups 26*a*-1, 26*a*-2, and 26*a*-3. The groups are separated by spacings considerably larger than the electrode pitch, and the wiring is led out with realignment from the electrode pitch for each group. As a result, compared to the case in which there is no division into groups, with the pitch realignment distance 1*a*, the wiring length can be considerably shortened.

In particular, the number of input electrodes of a driver integrated circuit component for a liquid crystal display device is considerably less than the number of output electrodes. In this case, according to this embodiment, without making the electrode pitch unreasonably small, an adequate spacing can be assured between the groups, and the input wiring distance can easily be reduced.

Alternatively, the electrodes and bumps on the input side may both be disposed at the same uniform pitch, and the row of electrodes and bumps on the output side may be separated into a plurality of groups separated by a spacing considerably greater than the electrode pitch. Besides, the rows of electrodes and bumps on the input and output sides can each be similarly divided into a plurality of groups, and the wiring distance can be reduced on both the input and output sides.

Alternatively, some of the output electrodes may be disposed in the row on the input side, so that the number of electrodes in each row is approximately equal, so that the electrode pitch is not excessively small in one row. In this case, if the row on the input side is divided into groups as described above, if the output electrodes are put into groups outside of the input electrodes, then on the tape carrier wiring can be led along the periphery of the device hole, from the inner leads on the input side to the outer leads on the output side.

Figure 7:
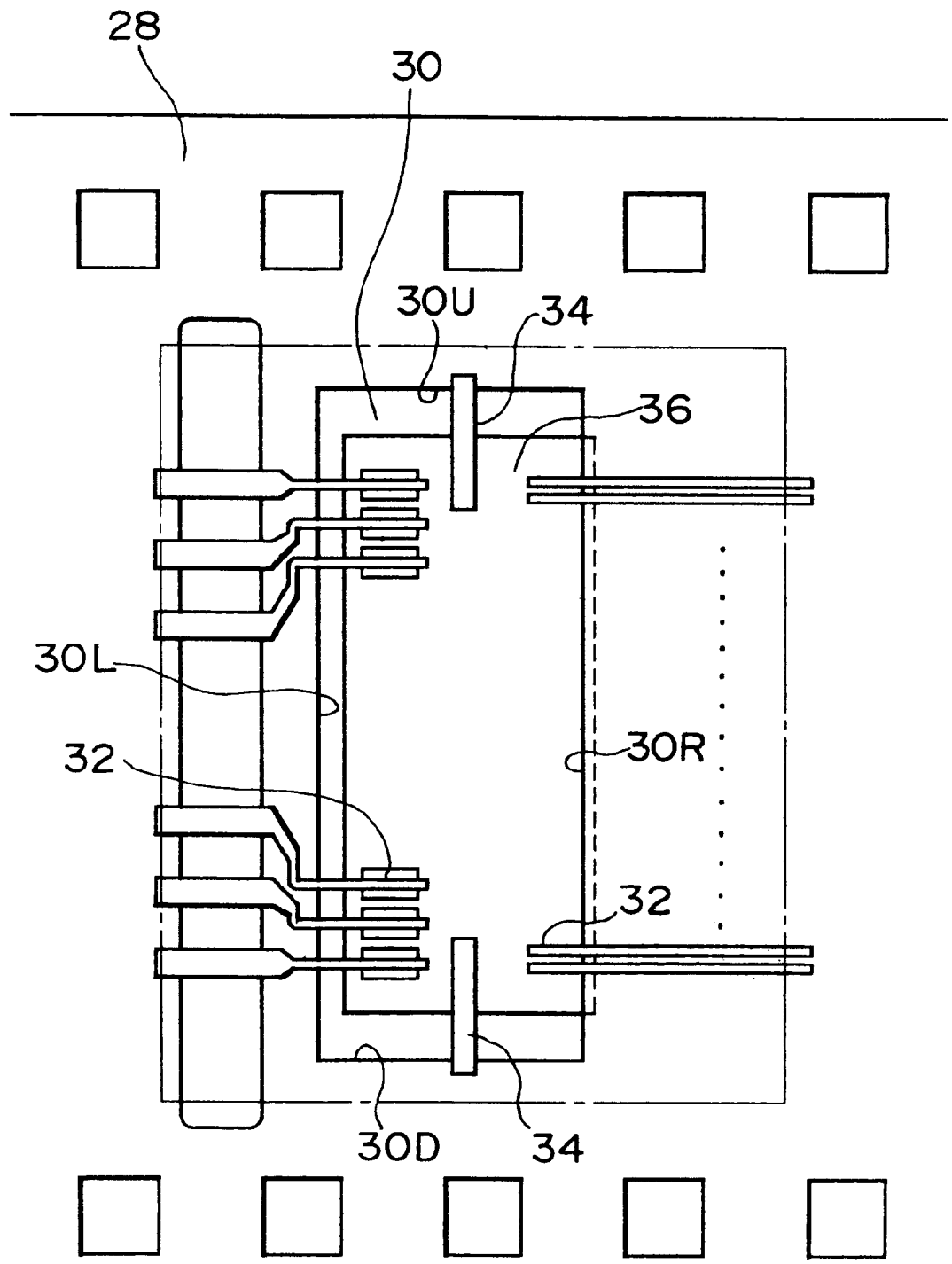
FIG. 7 is an enlarged partial view of a third embodiment of the tape carrier of the invention.

Besides, in FIG. 7 is shown an enlarged partial view of a third embodiment of the tape carrier of the invention. As shown in this figure, the tape carrier 28 of this third embodiment is provided with a device hole 30 of rectangular shape elongated in the direction perpendicular to the longitudinal direction of the tape carrier 28, and in this device hole 30 from borders 30L and 30R in the direction perpendicular to the longitudinal direction of the tape carrier 28 are provided inner leads 32 extending into the device hole 30. Also in the device hole 30 from each of borders 30U and 30D perpendicular to the borders 30L and 30R are provided each of dummy leads 34 extending in the direction perpendicular to the inner leads 32, to pass between the ends of opposing inner leads 32.

On this tape carrier 28 is mounted an integrated circuit component 36 provided with electrodes disposed in two rows along the longitudinal direction, and also electrodes for connection to the dummy leads 34 at both longitudinal ends.

Here the procedure for mounting the integrated circuit component 36 on the tape carrier 28 provided with the inner leads 32 and the dummy leads 34 is described. First the integrated circuit component 36 held in a vacuum suction jig not shown in the drawings is moved to a position where electrodes contact the inner leads 32 and dummy leads 34. Thereafter, toward the side opposite to the vacuum suction jig, that is to say, toward the side of the integrated circuit component 36 where electrodes are provided, a bonding tool (thermal jig) approaches, and thermally bonds the inner leads 32 and dummy leads 34 to the electrodes. Here, since the coefficient of thermal expansion of the tape carrier 28 is larger than the coefficient of thermal expansion of the integrated circuit component 36, the tape carrier 28 stretches, and the two are connected in the state that the pitch spacing of the inner leads 32 is wider than the pitch spacing of the electrodes. After this connection, since the bonding tool (thermal jig) is removed from the integrated circuit component 36 and tape carrier 28, the temperature of the connected positions falls, and the tape carrier 28 begins to shrink along the direction of the electrode alignment. However, in the direction of the electrode alignment, the pair of dummy leads 34 is provided at top and bottom as shown in the figure, as a result of which the contracting force of the tape carrier 28 is withstood. For this reason, the shrinkage of the tape carrier 28 is restricted, and breakage of inner leads 32 due to shrinkage of the tape carrier 28 can be prevented.

Figure 8:
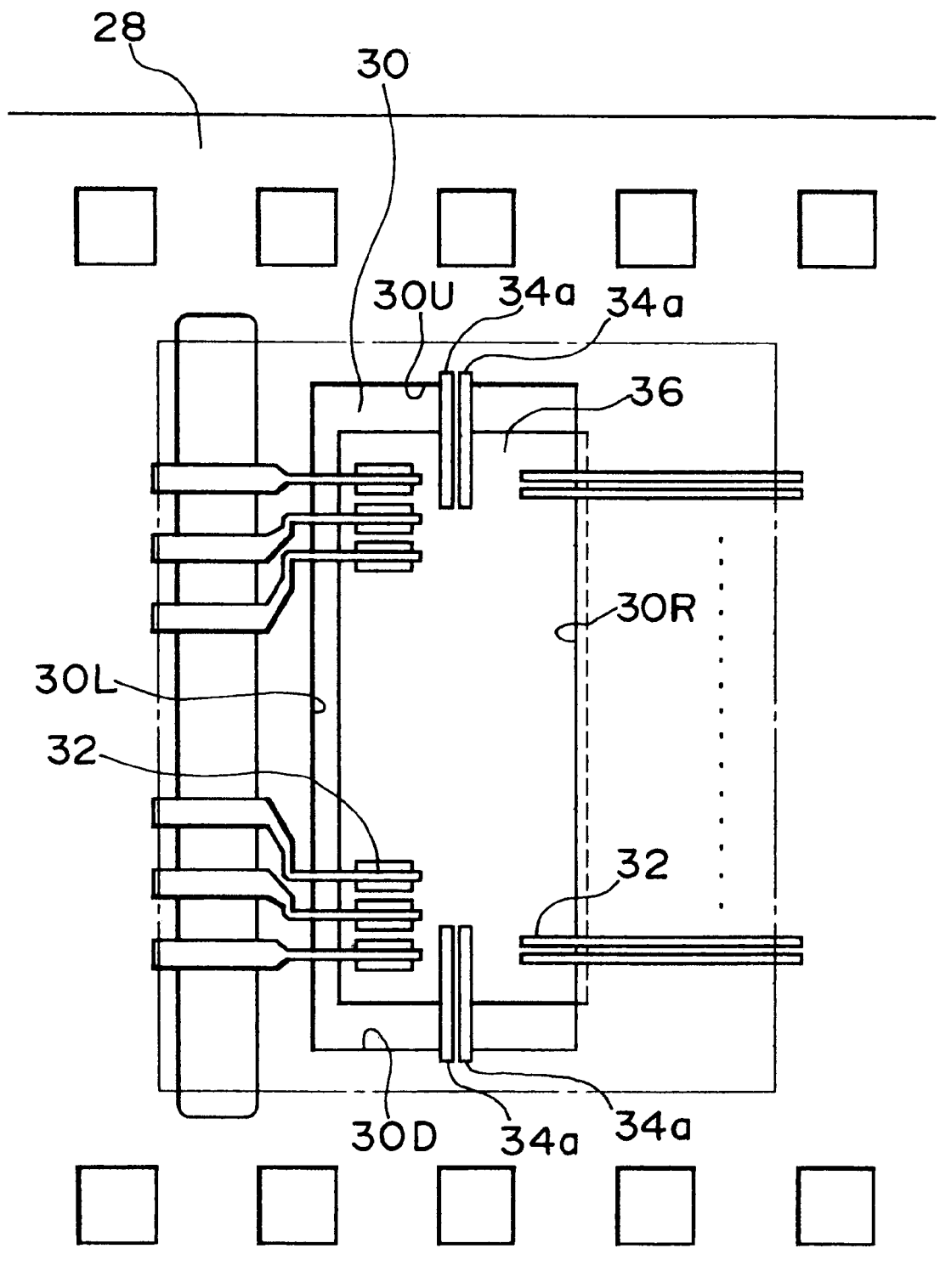
FIG. 8 shows a variant of the third embodiment of the tape carrier.

FIG. 8 shows an example of application of the third embodiment of the tape carrier. In this figure, from each of the borders 30U and 30D extend a plurality (two) of dummy leads 34a of width narrower than the dummy leads 34, but the rest of the construction is the same as that of FIG. 7. As shown in FIG. 8, by the provision of a plurality of finer dummy leads 34a, after the integrated circuit component 36 is mounted on the tape carrier 28, when a sealing material is applied around the periphery of the integrated circuit component 36, air can easily escape from the gap between the dummy leads 34a. For this reason, residual air bubbles on the rear surface of the dummy leads 34a can be prevented. Besides, since the dummy leads 34a are narrow, when heated by the bonding tool (thermal jig), excessive heat dissipation is reduced, and the quality of bonding of inner leads 32 around the dummy leads 34a can be improved.

Figure 9:
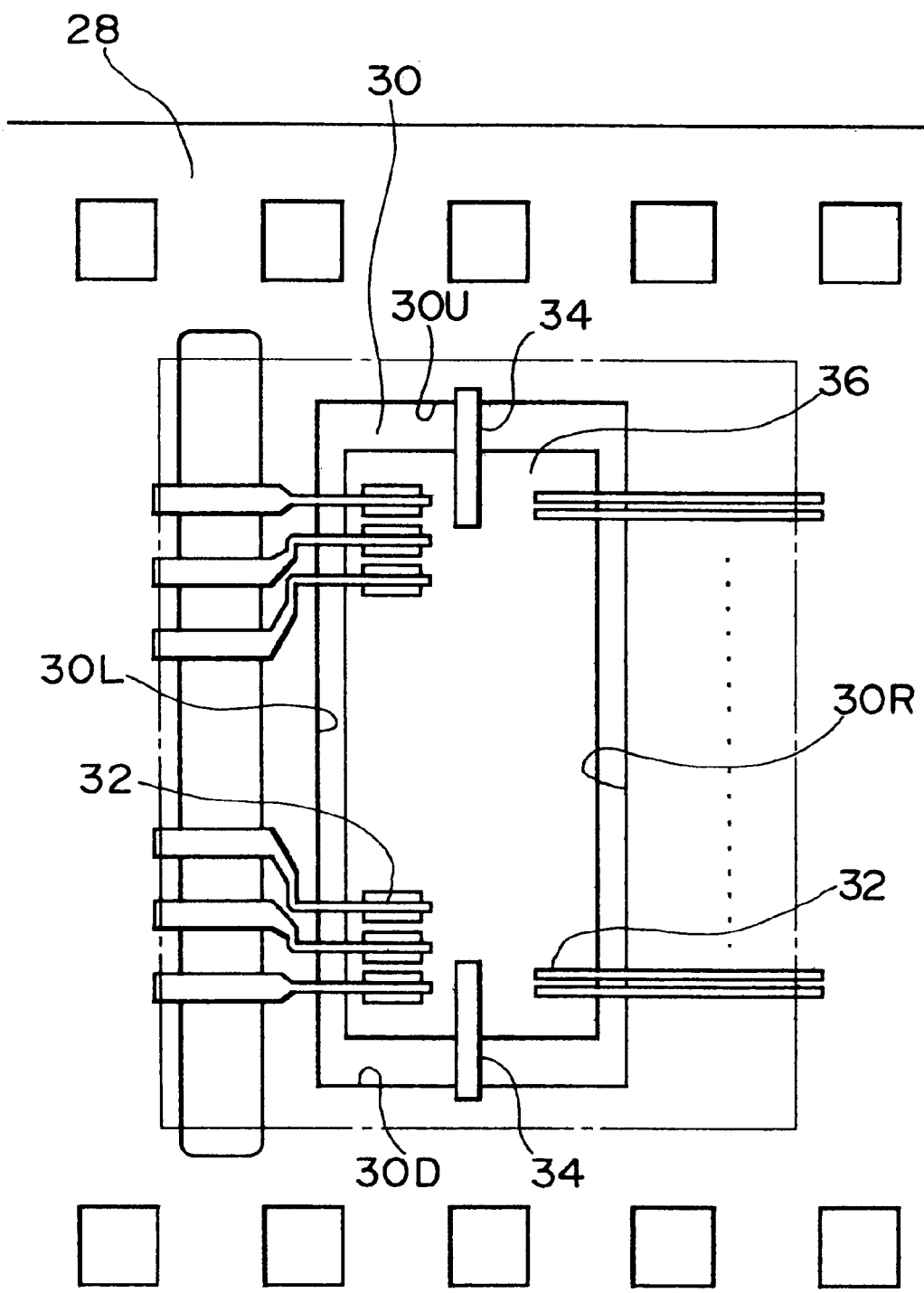
FIG. 9 is an enlarged partial view of the connections of inner leads and dummy leads to an integrated circuit component disposed within a device hole.
Figure 10:
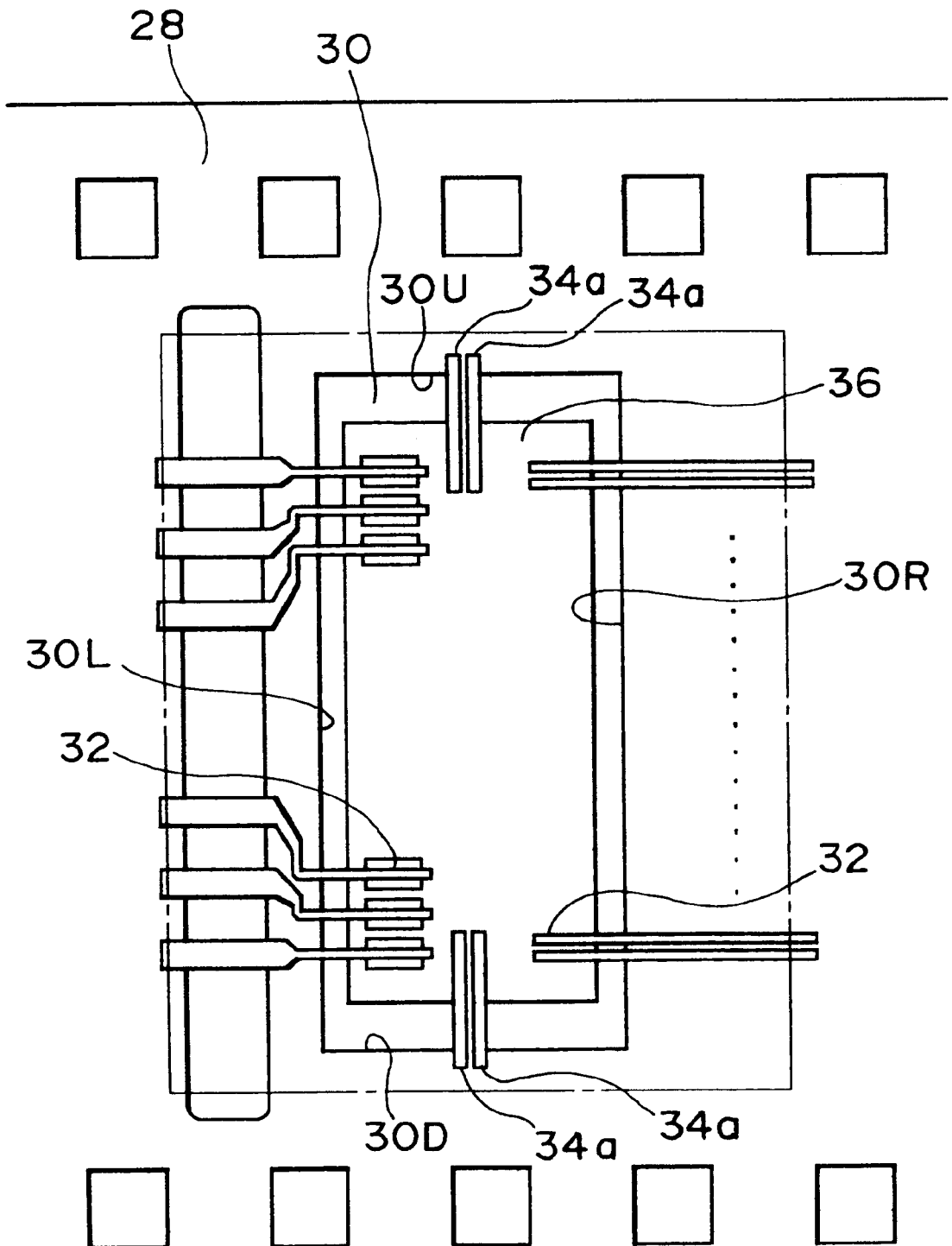
FIG. 10 shows a variant of the embodiment of FIG. 9.

Besides, in FIG. 9, is shown an enlarged partial view of the connections of inner leads and dummy leads to an integrated circuit component disposed within a device hole, and in FIG. 10 is shown a variant thereof. As shown in these figures, even with the integrated circuit component 36 positioned in the interior of the device hole 30, in the same way as in the third embodiment described above, contraction of the tape carrier 28 can be withstood by the dummy leads 34, and as a result breaking the inner leads 32 wires through tension toward the borders 30L and 30R can be prevented.

Figure 11:
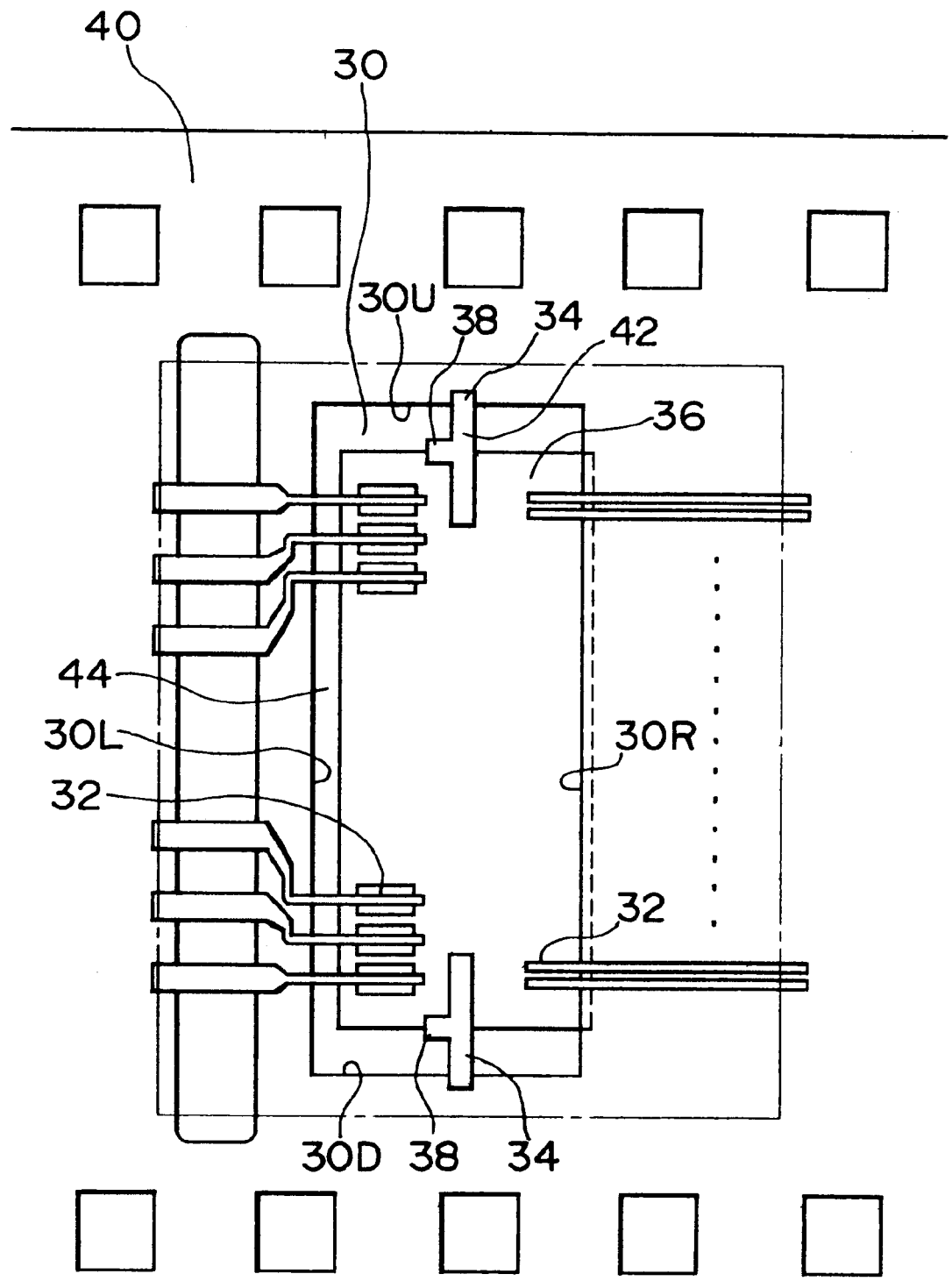
FIG. 11 is an enlarged partial view of a fourth embodiment of the tape carrier.
Figure 12:
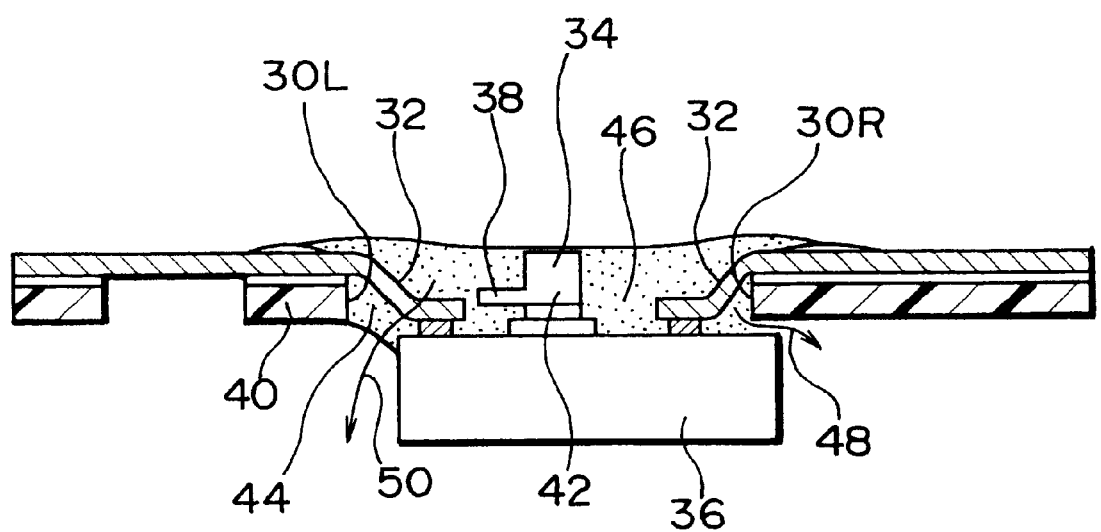
FIG. 12 shows the arrangement of an integrated circuit device having the integrated circuit component mounted on the tape carrier.

FIG. 11 is an enlarged partial view of a fourth embodiment of the tape carrier. In this figure, a tape carrier 40 has the dummy leads 34 of the third embodiment of the tape carrier shown in FIG. 7 with projections 38 formed projecting from one side. Then FIG. 12 shows the arrangement of an integrated circuit device having the integrated circuit component 36 mounted on the tape carrier 40. As shown in these figures, the projections 38 are provided on forming portions 42 of the dummy leads 34. The forming portions 42 bend down in such a way as to overcome the non-coplanarity of the surface of the tape carrier 40 where dummy leads 34 are provided and the surface of the integrated circuit component 36 where the electrodes are provided. The projections 38 on the forming portions 42 project in the direction to a gap 44 formed between the border 30L of the device hole 30 and the integrated circuit component 36 (toward the input side of the integrated circuit component 36). By thus forming the projections 38 on the forming portions 42 of the dummy leads 34, a sealing material 46 is prevented from passing via the gap 44 to the rear surface of the tape carrier 40 and fluctuation of the thickness (thinning) of the sealing material 46 on the integrated circuit component 36 can be prevented. It should be noted that the sealing material 46 is applied to the periphery of the integrated circuit component 36 after connecting the integrated circuit component 36 to the inner leads 32 and dummy leads 34.

In more detail, since the gap between portions of the tape carrier 40 and the integrated circuit component 36 facing each other (on the output side of the integrated circuit component 36), no large quantity of the sealing material 46 passes along the path shown by an arrow 48 to the rear surface of the tape carrier 40. On the other hand, from the gap 44 in the device hole 30, because of the area of its opening, a large quantity of sealing material can pass along the path shown by an arrow 50 to the rear surface of the tape carrier 40. However, by forming the projections, on the dummy leads 34, corresponding to the width of the dummy leads 34, surface tension of the sealing material 46 is produced, and the amount of the sealing material 46 passing through the gap 44 to the rear surface of the tape carrier 40 can be reduced. In this way the thickness of the applied sealing material 46 can be maintained constant. It should be noted that the dummy leads 34 shown in FIGS. 7 to 12 are not electrically connected to the integrated circuit component 36. For this reason, for the connection of the dummy leads 34 to the integrated circuit component 36, it is not necessary to consider conditions relating to electrical conductivity, and any form only to improve the bonding strength can be applied.

Figure 13A:
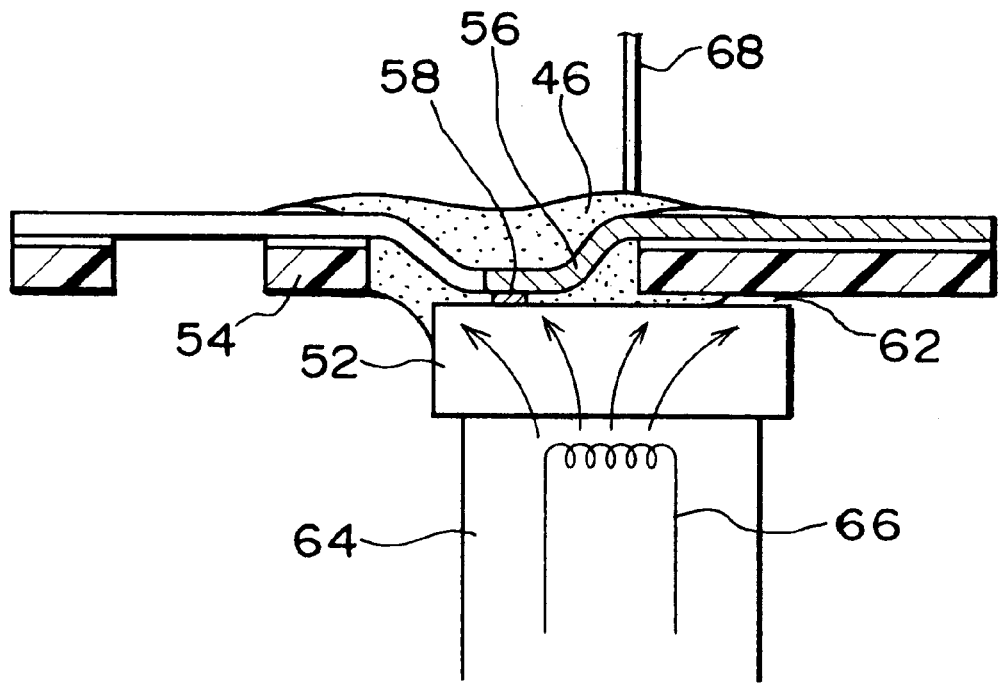
FIGS. 13A and 13B are explanatory views of the procedure of mounting the integrated circuit component on the tape carrier.
Figure 13B:
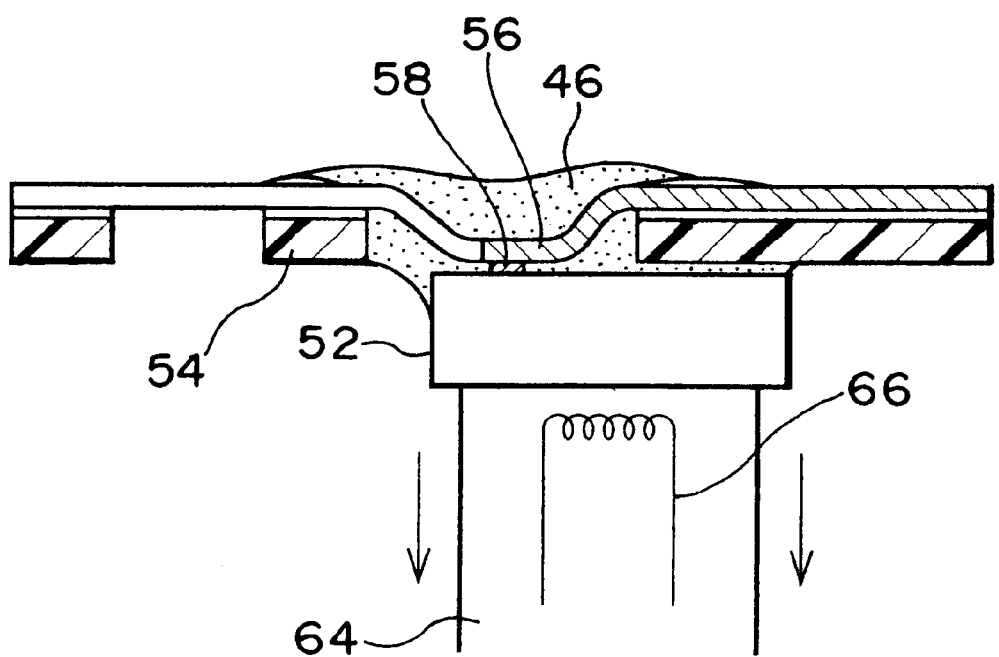
Figure 14:
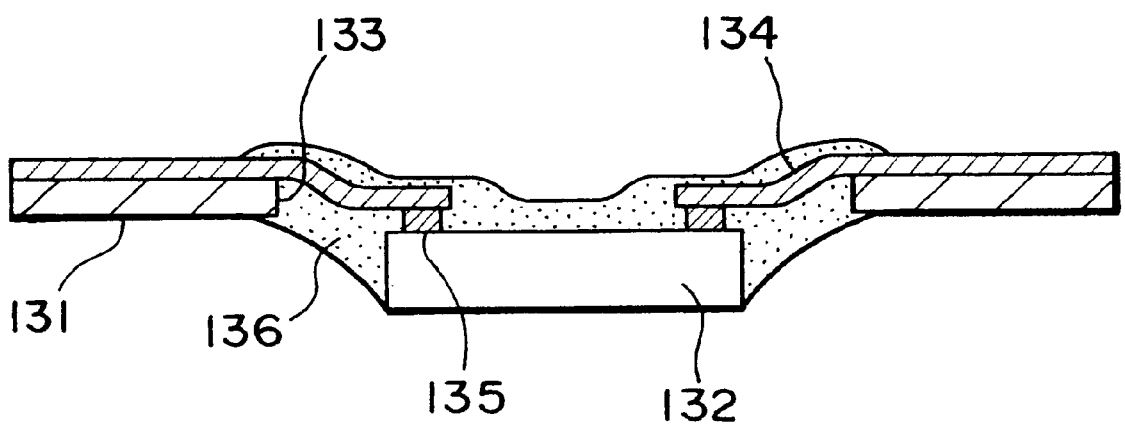
FIG. 14 is a sectional view showing a conventional TAB package integrated circuit device.
Figure 15:
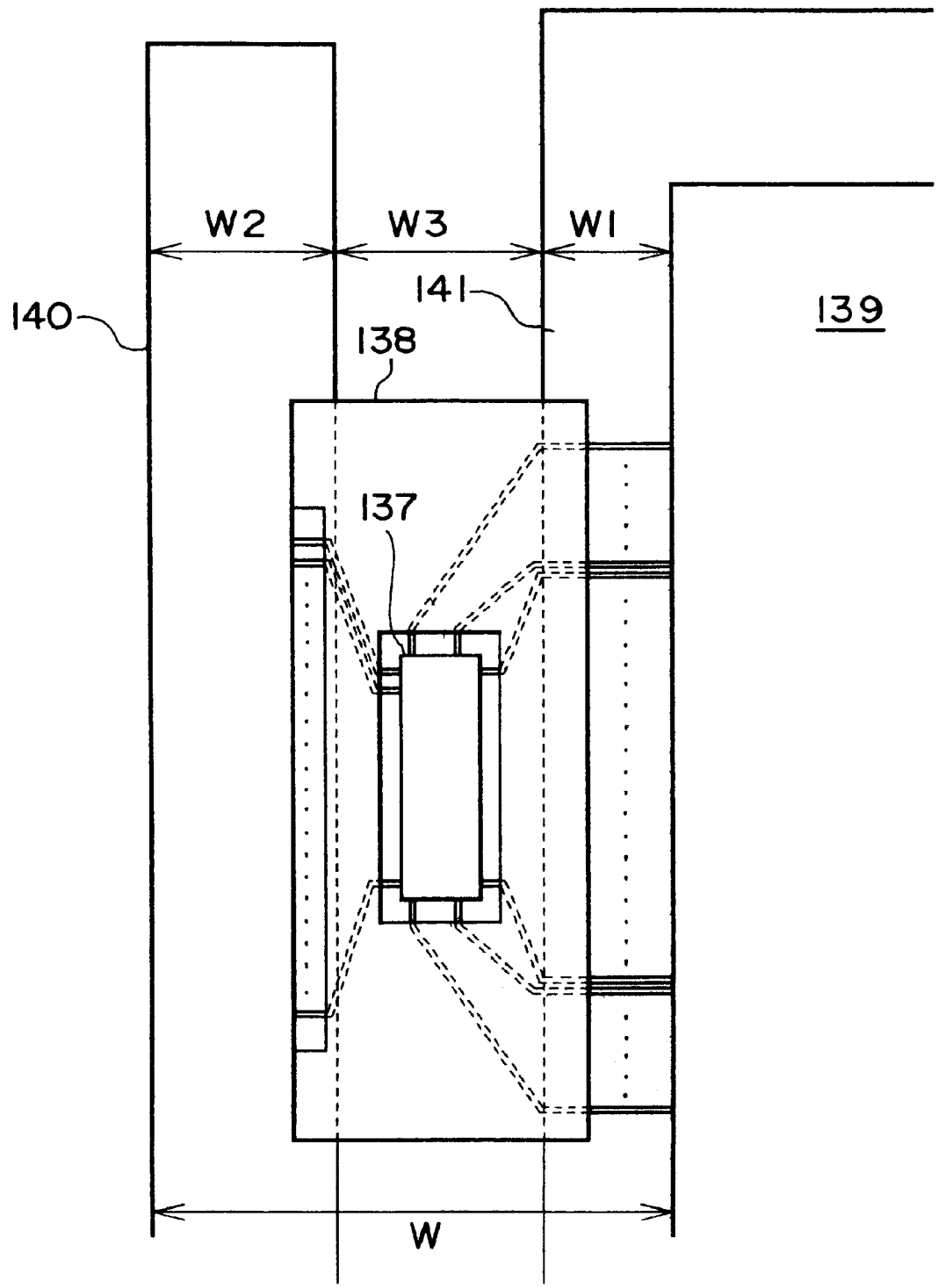
FIG. 15 is a plan view showing a portion of a conventional LCD cell having mounted the TAB package of FIG. 14.
Figure 16:
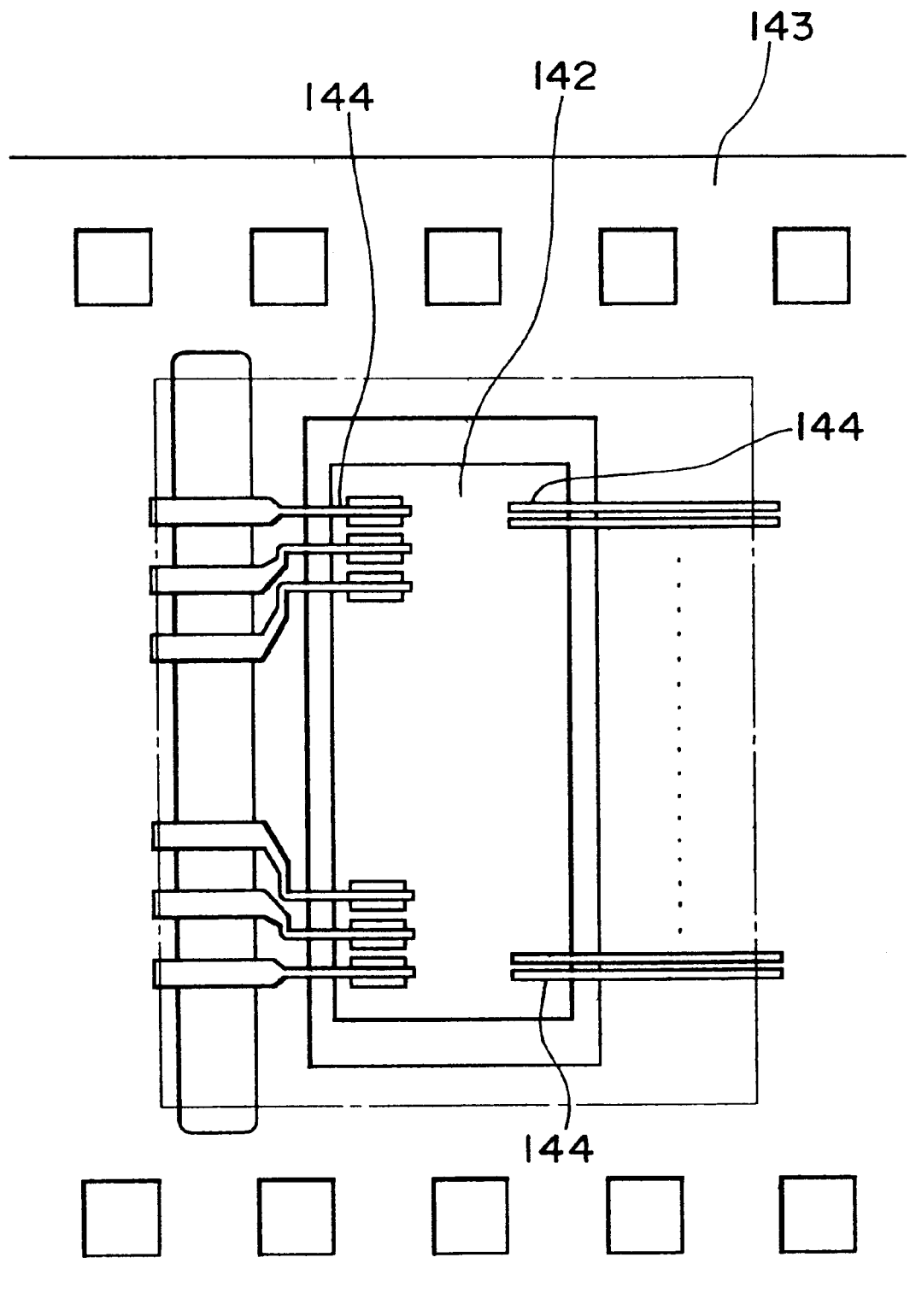
FIG. 16 shows the arrangement of a conventional integrated circuit component and tape carrier.

Besides, FIG. 13 illustrates the procedure of mounting the integrated circuit component on the tape carrier. As shown in this figure, after connecting inner leads 56 and electrodes having bumps 58 formed, a sealing material 46 is applied, and exposure of the inner leads 56 and electrodes is prevented. Here, in order to improve the degree to which the sealing material 46 penetrates the gap 62 between the tape carrier 54 and the integrated circuit component 52 a heater 66 being a heating means may be provided to the vacuum suction jig 64 holding and moving the integrated circuit component 52 to the mounting position. In other words, if the heater 66 is provided within the vacuum suction jig 64, while the vacuum suction jig 64 is holding the integrated circuit component 52, heat is applied by the heater 66 to the integrated circuit component 52. Thus by this heating effect, the sealing material 46 supplied by a sealing material supply pipe 68 has its viscosity reduced, and thus more positively fills the gap 62. After the process of applying the sealing material 46 is completed, the vacuum suction jig 64 may be removed from the integrated circuit component 52. When the vacuum suction jig 64 is removed from the integrated circuit component 52, the integrated circuit component 52 cools, and the viscosity of the sealing material 46 filling the gap 62 increases, whereby the sealing material 46 can be positively contained between the tape carrier 54 and the integrated circuit component 52. Besides, the above described sealing material 46 may be a thermoplastic resin, or a thermosetting resin, or the like, being a resin deformed by heat.

The invention has been described above using a number of preferred embodiments, but these embodiments do not limit the scope of the invention and the invention can be carried out with various variations and modifications.

I claim:

1. An integrated circuit device, comprising:
    a base material having an insulating property and having an opening;
    a plurality of connection leads provided on said base material, said connection leads extending into said opening; and
    an integrated circuit component connected to said connection leads inside said opening, said integrated circuit component including a first portion at its one end portion and a second portion at its other end portion, an edge of said first portion being positioned inside of said opening, said first portion inside of said opening provided with a plurality of electrodes electrically connected to said connection leads, said second portion and said base material overlapping, at least one of said connection leads provided on a portion of said base material which said second portion faces.

2. The integrated circuit device of claim 1, wherein a pitch between a pair of said connection leads is converted on said portion of said base material to which said second portion of said integrated circuit component faces.

3. The integrated circuit device of claim 1, wherein said opening is smaller than said integrated circuit component.

4. The integrated circuit device of claim 1, wherein said integrated circuit component has an oblong shape, said first portion has an edge portion forming one of long sides of said oblong shape, and said electrodes of said integrated circuit component are disposed in one row along said one of long sides.

5. The integrated circuit device of claim 1, wherein said integrated circuit component has an oblong shape, said first portion has an edge portion forming one of long sides of said oblong shape, and said electrodes of said integrated circuit component are disposed in two rows along said one of long sides.

6. The integrated circuit device of claim 1, further comprising:
    a sealing material sealing at least connection portions between said electrodes of said integrated circuit component and said connection leads.

7. The integrated circuit device of claim 6, wherein said dummy lead has a width narrower than a width of each of said connection leads.

8. The integrated circuit device of claim 6, wherein said dummy lead has at least one projection, said projection formed in a direction substantially perpendicular to an extending direction of said dummy lead.

9. The integrated circuit device of claim 8, wherein said dummy lead has a bending portion, and said projection extends from said bending portion of said dummy leads.

10. The integrated circuit device of claim 6, wherein a width of said dummy lead is wider than a width of each of said connection leads.

11. The integrated circuit device of claim 6, wherein said dummy lead is electrically insulated from said electrodes of said integrated circuit component.

12. The integrated circuit device of claim 1, wherein more than half of said connection leads are formed on said portion of said base material to which said second portion of said integrated circuit component faces.

13. The integrated circuit device of claim 1, wherein:
    a first group of said connection leads are formed on said portion of said base material to which said second portion of said integrated circuit component faces;
    a second group of said connection leads are formed avoiding said portion of said base material to which said second portion of said integrated circuit component faces;
    said first group of connection leads are connected to output sides of said electrodes of said integrated circuit component; and
    said second group of connection leads are connected to input sides of said electrodes of said integrated circuit component.

14. An electronic apparatus comprising said integrated circuit device of claim 1.

* * * * *